(12) United States Patent
Park et al.

(10) Patent No.: US 10,157,787 B2
(45) Date of Patent: Dec. 18, 2018

(54) METHOD AND APPARATUS FOR DEPOSITING COBALT IN A FEATURE

(71) Applicant: APPLIED MATERIALS, INC., Santa Clara, CA (US)

(72) Inventors: Jin Hee Park, Santa Clara, CA (US); Tae Hong Ha, San Jose, CA (US); Sang-Hyeob Lee, Fremont, CA (US); Thomas Jongwan Kwon, Dublin, CA (US); Jaesoo Ahn, Fremont, CA (US); Xianmin Tang, San Jose, CA (US); Er-Xuan Ping, Fremont, CA (US); Sree Kesapragada, Union City, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/384,219

(22) Filed: Dec. 19, 2016

(65) Prior Publication Data
US 2017/0178956 A1   Jun. 22, 2017

Related U.S. Application Data

(60) Provisional application No. 62/269,034, filed on Dec. 17, 2015.

(51) Int. Cl.
*H01L 21/768* (2006.01)
*H01L 21/285* (2006.01)
(Continued)

(52) U.S. Cl.
CPC ...... *H01L 21/76879* (2013.01); *C23C 16/045* (2013.01); *C23C 16/16* (2013.01); *C23C 16/18* (2013.01); *C23C 16/45512* (2013.01); *C23C 16/45561* (2013.01); *C23C 16/481* (2013.01); *C23C 16/56* (2013.01); *H01L 21/28556* (2013.01); *H01L 21/28568* (2013.01); *H01L 21/67017* (2013.01); *H01L 21/6719* (2013.01);
(Continued)

(58) Field of Classification Search
CPC ......... H01L 2924/0002; H01L 2924/00; H01L 21/0206; H01L 21/02068; H01L 21/67069
See application file for complete search history.

(56) References Cited

U.S. PATENT DOCUMENTS

| | | | |
|---|---|---|---|
| 2010/0081276 A1* | 4/2010 | Ishizaka | H01L 21/02063 438/653 |
| 2011/0011338 A1* | 1/2011 | Chuc | C23C 16/452 118/715 |

(Continued)

*Primary Examiner* — Tony Tran
(74) *Attorney, Agent, or Firm* — Moser Taboada; Alan Taboada

(57) ABSTRACT

Methods and apparatus for depositing a cobalt layer in a feature, such as, a word line formed in a substrate, are provided herein. In some embodiments, method of processing a substrate includes: exposing a substrate at a first temperature to a cobalt containing precursor to deposit a cobalt layer within a word line feature formed in the substrate, wherein the word line feature is part of a 3D NAND device; and annealing the substrate to remove contaminants from the cobalt layer and to reflow the cobalt layer into the word line feature, wherein the substrate is at a second temperature greater than the first temperature during the annealing.

5 Claims, 5 Drawing Sheets

(51) Int. Cl.

| | |
|---|---|
| *C23C 16/48* | (2006.01) |
| *C23C 16/455* | (2006.01) |
| *C23C 16/04* | (2006.01) |
| *C23C 16/16* | (2006.01) |
| *C23C 16/18* | (2006.01) |
| *C23C 16/56* | (2006.01) |
| *H01L 21/67* | (2006.01) |
| *H01L 23/532* | (2006.01) |
| *H01L 27/11556* | (2017.01) |
| *H01L 27/11582* | (2017.01) |

(52) U.S. Cl.
CPC .. *H01L 21/67109* (2013.01); *H01L 21/67115* (2013.01); *H01L 21/76843* (2013.01); *H01L 21/76876* (2013.01); *H01L 21/76883* (2013.01); *H01L 23/53209* (2013.01); *H01L 27/11556* (2013.01); *H01L 27/11582* (2013.01)

(56) References Cited

U.S. PATENT DOCUMENTS

| | | |
|---|---|---|
| 2012/0012465 A1 | 1/2012 | Kim et al. |
| 2012/0141667 A1 | 6/2012 | Kim et al. |
| 2016/0017482 A1 | 1/2016 | Trivedi |

\* cited by examiner

METHOD AND APPARATUS FOR DEPOSITING COBALT IN A FEATURE

CROSS-REFERENCE TO RELATED APPLICATIONS

This application claims benefit of U.S. provisional patent application Ser. No. 62/269,034, filed Dec. 17, 2015, which is herein incorporated by reference in its entirety.

FIELD

Embodiments of the present disclosure generally relate to substrate processing methods and apparatus, and more specifically, to methods and apparatus for depositing cobalt on a substrate.

BACKGROUND

Tungsten (W) is typically used in multiple applications for semiconductor device fabrication. For example, W has been used in the chemical vapor deposition (CVD) metal filling of features such as, for example, word lines in three dimensional (3D) NAND devices. Presently, bulk W is deposited in word lines in which an oxide layer has already been formed. However, the inventors have discovered that the bulk W fill may produce undesirable effects. For example, W fill induces bowing in the substrate. Other issues with W CVD are seams formed when W fills a word line, high resistivity, the use of fluorine (F) which causes damage to the oxide layer, and damage caused to the substrate from the necessary etching step required to remove deposited W from the sidewalls of the word line.

Therefore, the inventors have provided embodiments of an improved method and apparatus for depositing cobalt in features formed in a substrate.

SUMMARY

Methods and apparatus for depositing a cobalt layer in a feature, such as, a word line formed in a substrate, are provided herein. In some embodiments, method of processing a substrate includes: exposing a substrate at a first temperature to a cobalt containing precursor to deposit a cobalt layer within a word line feature formed in the substrate, wherein the word line feature is part of a 3D NAND device; and annealing the substrate to remove contaminants from the cobalt layer and to reflow the cobalt layer into the word line feature, wherein the substrate is at a second temperature greater than the first temperature during the annealing.

In some embodiments, a substrate processing chamber includes: a chamber body having a processing volume; a substrate support disposed within the chamber body and having a support surface to support a substrate; a showerhead disposed opposite the substrate support configured to expose the substrate to a cobalt containing precursor; a heat source disposed within the substrate support configured to heat the substrate to a predetermined temperature; a first ampoule containing a cobalt precursor and coupled to the substrate processing chamber; and a second ampoule containing the cobalt precursor and coupled to the substrate processing chamber.

In some embodiments, a computer readable medium, having instructions stored thereon which, when executed, cause a process chamber to perform a method for processing a substrate. The method may be as described in any of the embodiments disclosed herein Other embodiments and variations of the present disclosure are discussed below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
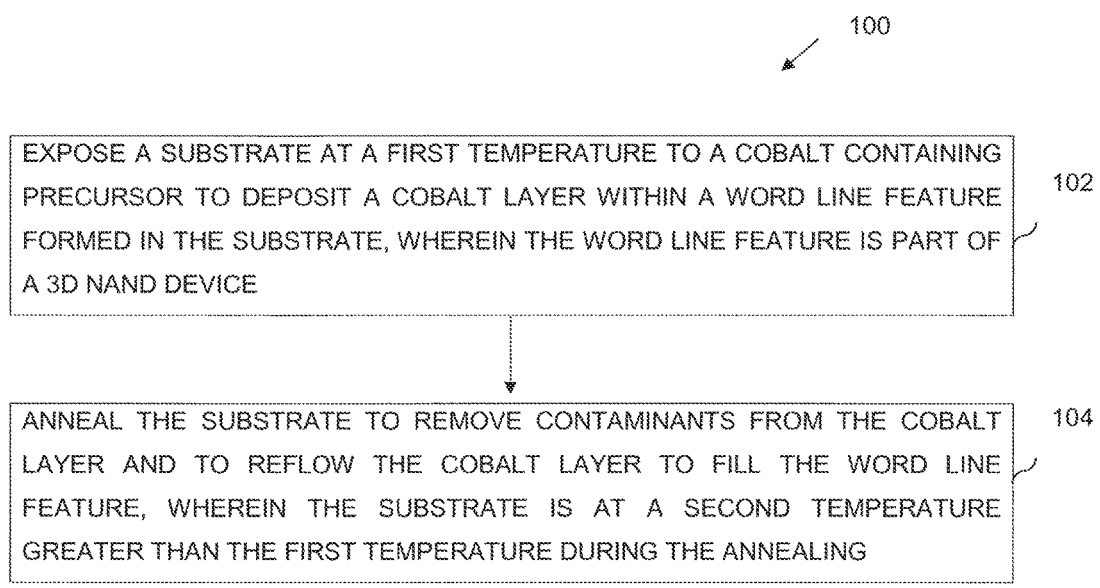
FIG. 1 depicts a method of depositing cobalt in a feature formed in a substrate in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods and apparatus for filling a feature in a substrate are provided herein. In accordance with embodiments of the present disclosure, cobalt is deposited within an opening and then annealed to drive out impurities. The disclosed methods and apparatus may advantageously minimize damage to a gate oxide layer, provide a conformal film in a high aspect ratio feature, provide a higher work function, and provide a low resistivity fill material. The disclosed methods and apparatus may further advantageously eliminate the need for or simplify a subsequent metal separation process (e.g. following filling a feature with cobalt) which would provide higher yield, cost benefit, and also utilize existing non fluorine based etching methods. Furthermore, unlike the tungsten fill process, the cobalt metal fill process is a fluorine free process providing large metal grains on each word line with low resistivity and low stress without forming seam voids.

Figure 2A:
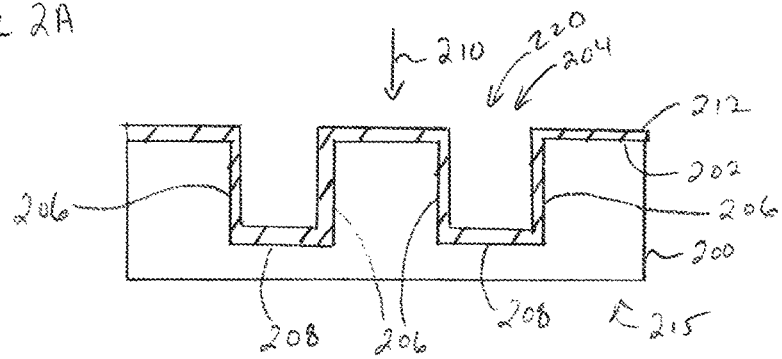
FIGS. 2A-D depicts the stages of filling a feature with cobalt in accordance with some embodiments of the present disclosure.
Figure 2B:
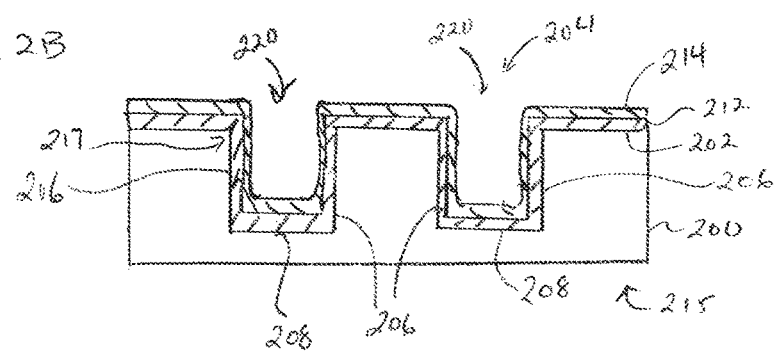

FIG. 1 is a flow diagram of a method 100 for depositing cobalt in accordance with some embodiments of the present disclosure. The method 100 is described below with respect to the stages of filling a feature with cobalt as depicted in FIGS. 2A-2B. Specifically, in some embodiments, the method 100 may be advantageously used in depositing a cobalt fill material for a three dimensional (3D) NAND word line.

Figure 3:
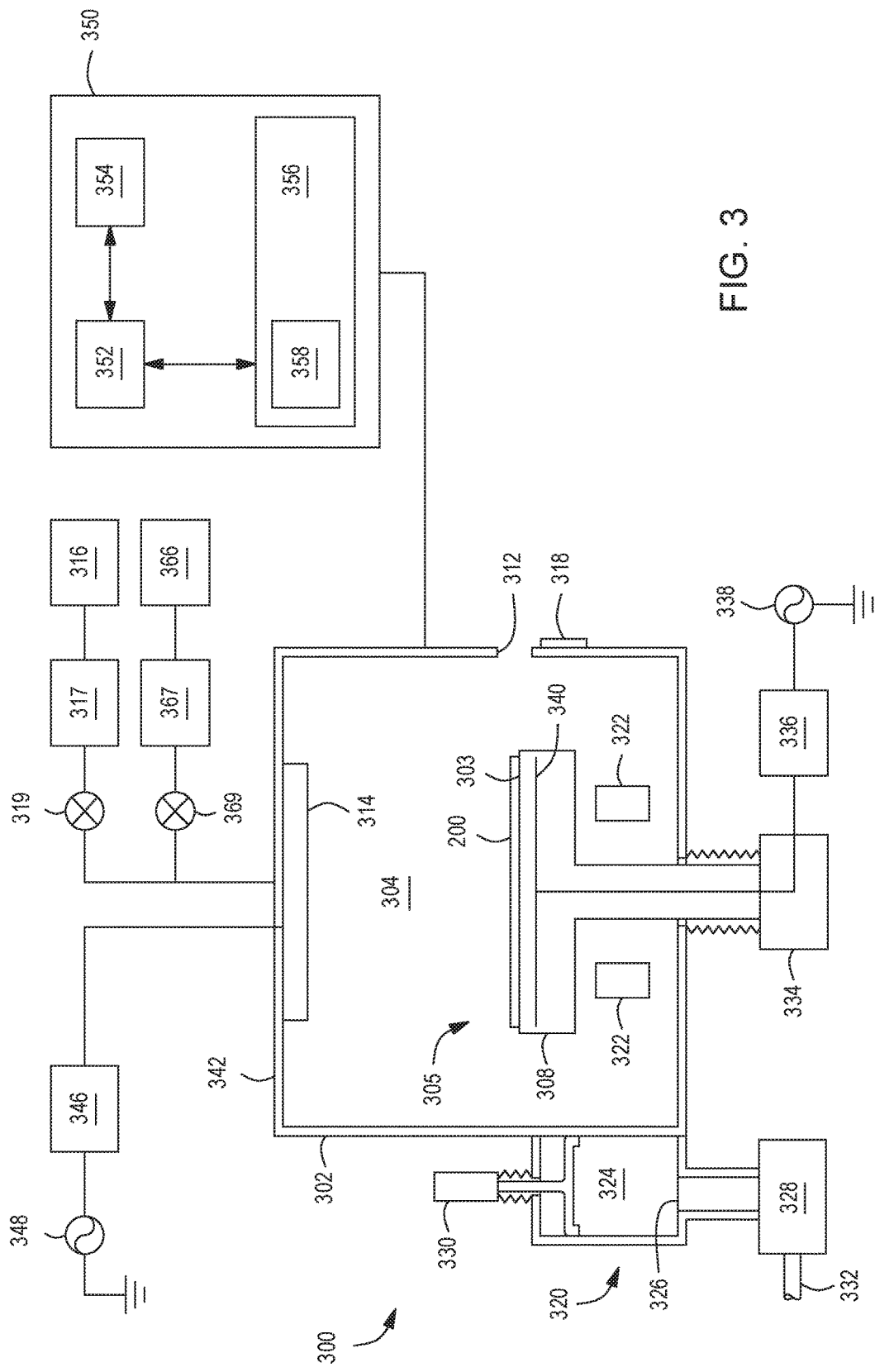
FIG. 3 depicts a process chamber suitable for performing a method of depositing cobalt in features formed in a substrate in accordance with some embodiments of the present disclosure.

The method 100 is performed on a substrate having an oxide layer disposed on a substrate support in the process chamber. For example, in some embodiment, the substrate support is substrate support 308 depicted in FIG. 3. FIG. 3 depicts a schematic diagram of an illustrative apparatus 300 of the kind that may be used to practice embodiments of the disclosure as discussed herein. The apparatus 300 depicted in FIG. 3 comprises a process chamber 302 having a substrate support 308 disposed in the process chamber and having a support surface 303 for supporting a substrate 200 during processing. In some embodiments, the substrate support 308 may include a mechanism that retains or supports the substrate 200 on the surface of the substrate support 308, such as an electrostatic chuck, a vacuum chuck, a substrate retaining clamp, or the like (not shown).

As depicted in FIG. 2A, the substrate 200 includes a first surface 202 having one or more features (e.g., word line 204) formed in the first surface 202 of the substrate 200. The substrate 200 may be any suitable substrate having a word line 204 formed on the substrate as part of a semiconductor device, such as 3D NAND devices. For example, the substrate 200 may comprise one or more of silicon (Si), silicon oxide ($SiO_2$), or the like. In some embodiments, the substrate 200 may be a semiconductor wafer (e.g., a 200 mm, 300 mm, or the like silicon wafer). In addition, the substrate 200 may include additional layers of materials or may have one or more completed or partially completed structures formed therein or thereon. In addition, the substrate may include additional layers of materials or may have one or more completed or partially completed structures formed therein or thereon. For example, in some embodiments, a gate stack may be disposed atop the substrate. In some embodiments, the gate stack may have a plurality of layers comprising any materials suitable to fabricate a device. For example, in some embodiments, the plurality of layers may include one or more oxide layers, such as silicon oxide (SiO2), one or more nitride layers, such as silicon nitride (SiN), combinations thereof, or the like.

The word line 204 comprises an opening 220 formed in the first surface 202 of the substrate 200 and extending into the substrate 200 towards an opposing second surface 215 of the substrate 200. The opening 220 may be formed by etching the substrate 200 using any suitable etch process. The opening 220 is defined by one or more sidewalls 206 and a bottom 208.

In some embodiments, a first layer 212 is formed atop the first surface 202, the bottom 208, and the sidewalls 206 prior to depositing cobalt material as described at 106 below. In some embodiments, the first layer 212 may be an oxide material, such as silicon oxide ($SiO_2$), aluminum oxide ($Al_2O_3$) or the like. The oxide material may be deposited or grown by any suitable oxidation process using any suitable process chamber, for example a chemical vapor deposition (CVD) chamber. The oxide material may serve as an electrical and/or physical barrier between the substrate and the cobalt-containing layer to be subsequently deposited in the opening 220, and/or may function as a better surface for attachment during the deposition process discussed below than a native surface of the substrate. In some embodiments, the first layer 212 may include a barrier material deposited atop the oxide layer. In some embodiments, an oxide layer is not present and the barrier material may be the first layer 212 formed atop the first surface 202, the bottom 208 and sidewalls 206 of the word line 204. The barrier material may serve a similar purpose as the oxide material discussed above. In some embodiments, the barrier material may include at least one of titanium (Ti), tantalum (Ta), and oxides or nitrides of Ti, Ta, or the like. The barrier material may be deposited by any suitable methods, such as by CVD or PVD. The adhesion between the cobalt layer and the barrier layer, for example TiN, provides balance between cobalt mobility for capillary effect and thermal stability.

The method begins at 102, and as depicted in FIGS. 2A and 2B, by exposing the substrate 200 to a cobalt containing precursor 210 to deposit a cobalt layer 214 atop the substrate 200 and within the word line 204. In some embodiments, the substrate 200 is exposed to the cobalt containing precursor 210 to deposit a cobalt layer 214 within the word line 204. As used herein depositing a cobalt layer 214 atop the substrate 200 and within the word line 204 refers to deposing on one or more of the first surface 202, the sidewalls 206, and/or the bottom 208 of the word line features or on any intervening material layer on the first surface 202, the sidewalls 206, and the bottom 208, if present. In some embodiments, there is less cobalt growth on vertical surfaces, such as the sidewalls 206, than on horizontal surfaces, such as the bottom 208. In some embodiments, there is no cobalt growth or very little cobalt growth on the sidewalls 206 as compared to the bottom (e.g., at least an order of magnitude difference). In some embodiments, the cobalt layer 214 is grown using a chemical vapor deposition process. In some embodiments, the cobalt layer 214 is grown using a fluorine-free chemical vapor deposition process. In some embodiments, suitable cobalt precursors may include cobalt carbonyl complexes, cobalt amidinate compounds, cobaltocene compounds, cobalt dienyl complexes, cobalt nitrosyl complexes, derivatives thereof, complexes thereof, plasmas thereof, or combinations thereof. In some embodiments, dicobalt hexacarbonyl acetyl compounds may be used to form the cobalt layer. Dicobalt hexacarbonyl acetyl compounds may have the chemical formula of $(CO)_6CO_2(RC\equiv CR')$, wherein R and R' are independently selected from hydrogen, methyl, ethyl, propyl, isopropyl, butyl, tertbutyl, penta, benzyl, aryl, isomers thereof, derivatives thereof, or combinations thereof. In one example, dicobalt hexacarbonyl butylacetylene (CCTBA, $(CO)_6CO_2(HC\equiv CtBu)$) is the cobalt precursor. Other examples of dicobalt hexacarbonyl acetyl compounds include dicobalt hexacarbonyl methylbutylacetylene ($(CO)_6CO_2(MeC\equiv CtBu)$), dicobalt hexacarbonyl phenylacetylene ($(CO)_6CO_2(HC\equiv CPh)$), hexacarbonyl methylphenylacetylene ($(CO)_6CO_2(MeC\equiv CPh)$), dicobalt hexacarbonyl methylacetylene ($(CO)_6CO_2(HC\equiv CMe)$), dicobalt hexacarbonyl dimethylacetylene ($(CO)_6CO_2(MeC\equiv CMe)$), derivatives thereof, complexes thereof, or combinations thereof. Other exemplary cobalt carbonyl complexes include cyclopentadienyl cobalt bis (carbonyl) ($CpCo(CO)_2$), tricarbonyl allyl cobalt ($(CO)_3Co(CH_2CH=CH_2)$), or derivatives thereof, complexes thereof, or combinations thereof. In some embodiments, the method may further comprise flowing a reactant gas, such as hydrogen ($H_2$), along with the precursor gases.

In some embodiments, the substrate 200 is exposed to the cobalt containing precursor 210 at a flow rate of about 50 to about 1000 sccm. In addition, the process chamber may be maintained at a pressure of about 3 to about 50 Torr. The substrate 200 is at a first temperature suitable for deposition of the cobalt layer, for example a temperature of about 100 degrees Celsius to about 300 degrees Celsius. In some embodiments, the cobalt layer 214 is grown to a suitable thickness for use in a semiconductor device, for example a thickness of about 20 to about 500 angstroms. The cobalt containing precursor 210 may be provided to the process chamber 302 using any suitable showerhead 314, as shown in FIG. 3. In some embodiments, cobalt material can form thicker on the first surface and along the upper corners 217 of the opening 220 than on the sidewalls 206 and bottom 208.

Figure 2C:
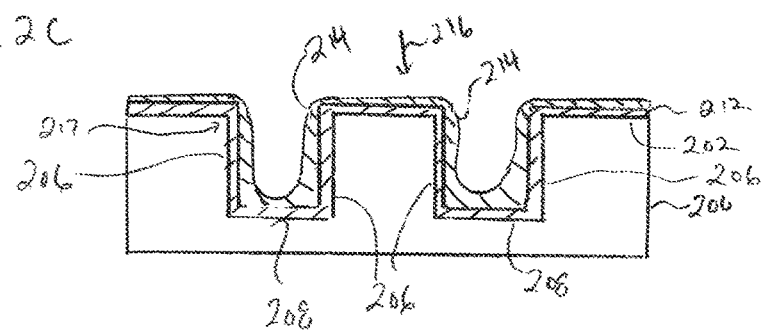

Next, at 104, and as depicted in FIG. 2C, the substrate 200 is annealed 216 to remove contaminants such as carbon, hydrogen, and oxygen from the cobalt layer via grain growth and to reflow the deposited cobalt. Reflow of the deposited cobalt material from the sidewalls 206 and first surface 202 results in a bottom-up fill of the word line 204 features. In some embodiments, the substrate 200 is annealed 216 in a hydrogen ($H_2$) gas atmosphere to remove impurities for large cobalt grain growth with low resistivity. The substrate 200 is annealed at a predetermined temperature of about 100 to about 1000 degrees Celsius. In some embodiments, the substrate 200 is annealed for suitable amount of time to remove contaminants, for example about 50 to about 150 seconds. In some embodiments, after annealing, the substrate 200 may be cooled to a temperature suitable for cobalt deposition. The inventors have discovered that the etching of W formed on the sidewalls in conventional processes negatively impacts the integrity of the substrate. As such, the inventors have discovered that by depositing cobalt and annealing the cobalt, such as in 106, capillary forces cause the cobalt layer 214 to reflow so that the cobalt flows away from the first surface 202 and the upper corners 217 and into the word line 204 features, resulting in little or no cobalt remaining on other portions of the substrate. In some embodiments, 102-104 can be repeated to fill the word line 204, as shown in FIG. 2D.

The substrate support 308 may include mechanisms for controlling the substrate temperature such as heating and/or cooling devices for heating the substrate and/or cooling the substrate. In some embodiments, the substrate support may comprise two heaters creating two heating zones, a center or inner heating zone and an edge or outer heating zone wherein the temperature of each zone is independently controllable. Alternatively, in some embodiments, the substrate 200 may be heated by a lamp head, which is disposed in a position relative to the substrate support 308 suitable to heat the substrate 200. The lamp head generates radiation which is directed to the top surface of the substrate 200. Alternatively or in combination, the lamp head may be configured to heat the bottom surface of the substrate 200, for example, such as by being disposed below the substrate support, or by directing the radiation to the bottom surface of the substrate 200. The lamps may be divided into multiple zones. The zones can be individually adjusted by a controller to allow controlled radiative heating of different areas of the substrate support.

In some embodiments, the temperature of the substrate 200 can be rapidly increased and decreased repeatedly to provide the temperatures used for deposition and anneal processes without removing the substrate from the substrate support until the processes are completed and a film (e.g., a cobalt film) is deposited to a predetermined final thickness.

Figure 2D:
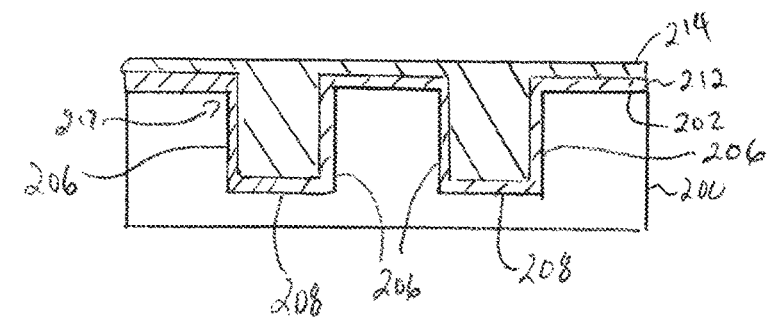

The above processes described at 102-104 may be repeated until the word line 204 is filled with a cobalt material (as depicted in FIG. 2D) or until the deposited cobalt layer has a reached a final thickness, for example any thickness suitable for a semiconductor manufacturing process. Further, in some embodiments, when the word line 204 has been filled by the cobalt material, the opening 220 may be filled above the level of the upper surface of the substrate and/or deposited material, for example from the cobalt material, may remain on the upper surface of the substrate 200. A chemical mechanical polishing process may be used to remove any excess material (e.g., cobalt, oxide layer, barrier layer, etc.) from the top surface of the substrate so that only the word line 204 is filled.

Returning to FIG. 3, the apparatus 300 may comprise a controller 350 and a process chamber 302 having an exhaust system 320 for removing excess process gases, processing by-products, or the like, from the inner volume 305 of the process chamber 302. Exemplary process chambers may include any of several process chambers configured for chemical vapor deposition (CVD), available from Applied Materials, Inc. of Santa Clara, Calif. Other suitable process chambers from other manufacturers may similarly be used. Such process chambers may be standalone process chambers or part of a cluster tool, such as the CENTURA®, ENDURA®, or PRODUCER® line of process tools also available from Applied Materials, Inc. of Santa Clara, Calif.

The process chamber 302 has an inner volume 305 that includes a processing volume 304. The processing volume 304 may be defined, for example, between a substrate support 308 disposed within the process chamber 302 for supporting substrate 200 upon the substrate support 308 during processing and one or more gas inlets, such as a showerhead 314 and/or nozzles provided at various locations. In some embodiments, the substrate support 308 may include a mechanism that retains or supports the substrate 200 on the surface of the substrate support 308, such as an electrostatic chuck, a vacuum chuck, a substrate retaining clamp, or the like (not shown). In some embodiments, the substrate support 308 may include mechanisms for controlling the substrate temperature and/or for controlling the species flux and/or ion energy proximate the substrate surface.

For example, in some embodiments, the substrate support 308 may include an RF bias electrode 340. The RF bias electrode 340 may be coupled to one or more bias power sources (one bias power source 338 shown) through one or more respective matching networks (matching network 336 shown). The one or more bias power sources may be capable of producing up to 1200 W or RF energy at a frequency of about 2 MHz to about 60 MHz, such as at about 2 MHz, or about 13.56 MHz, or about 60 Mhz. In some embodiments, two bias power sources may be provided for coupling RF power through respective matching networks to the RF bias electrode 340 at respective frequencies of about 2 MHz and about 13.56 MHz. The at least one bias power source may provide either continuous or pulsed power. In some embodiments, the bias power source alternatively may be a DC or pulsed DC source.

The substrate 200 may enter the process chamber 302 via an opening 312 in a wall of the process chamber 302. The opening 312 may be selectively sealed via a slit valve 318, or other mechanism for selectively providing access to the interior of the chamber through the opening 312. The substrate support 308 may be coupled to a lift mechanism 334 that may control the position of the substrate support 308 between a lower position (as shown) suitable for transferring the substrate into and out of the chamber via the opening 312 and a selectable upper position suitable for processing. The process position may be selected to maximize process uniformity for a particular process. When in at least one of the elevated processing positions, the substrate support 308 may be disposed above the opening 312 to provide a symmetrical processing region.

The one or more gas inlets (e.g., the showerhead 314) may be coupled to a gas supply (i.e., first ampoule 316) for providing one or more process gases (i.e., cobalt precursor) through a first mass flow controller 317 into the processing volume 304 of the process chamber 302. In addition, a first valve 319 may be provided to control the flow of the one or more process gases. The first mass flow controller 317 and first valve 319 may be used individually, or in conjunction to provide the process gases at given flow rates at a constant flow rate, or pulsed (as described above). The inventors have discovered that due to the size limitations of the gas supply lines, fittings, etc., the necessary partial pressure necessary for the deposition of the cobalt layer cannot be achieved. As such, the inventors have added a second ampoule 366 coupled to the one or more gas inlets (e.g., the showerhead 314) through a second mass flow controller 367 and a valve 369.

However, simply coupling an additional ampoule to the showerhead may not be enough to achieve the necessary partial pressure needed for the cobalt deposition process described above. Conventional feedthrough assemblies include one conduit fluidly coupled to a gas mixer fluidly coupled to the showerhead. Both precursor and carrier gases are fed to the one conduit. Thus, a bottleneck may occur at such a feedthrough assembly when coupled to the first and second ampoules 316, 366 because more precursor gas would be fed to a singular channel in addition to the carrier gas. As such, the inventors have developed an improved feedthrough assembly 400 (depicted in FIG. 4).

Figure 4:
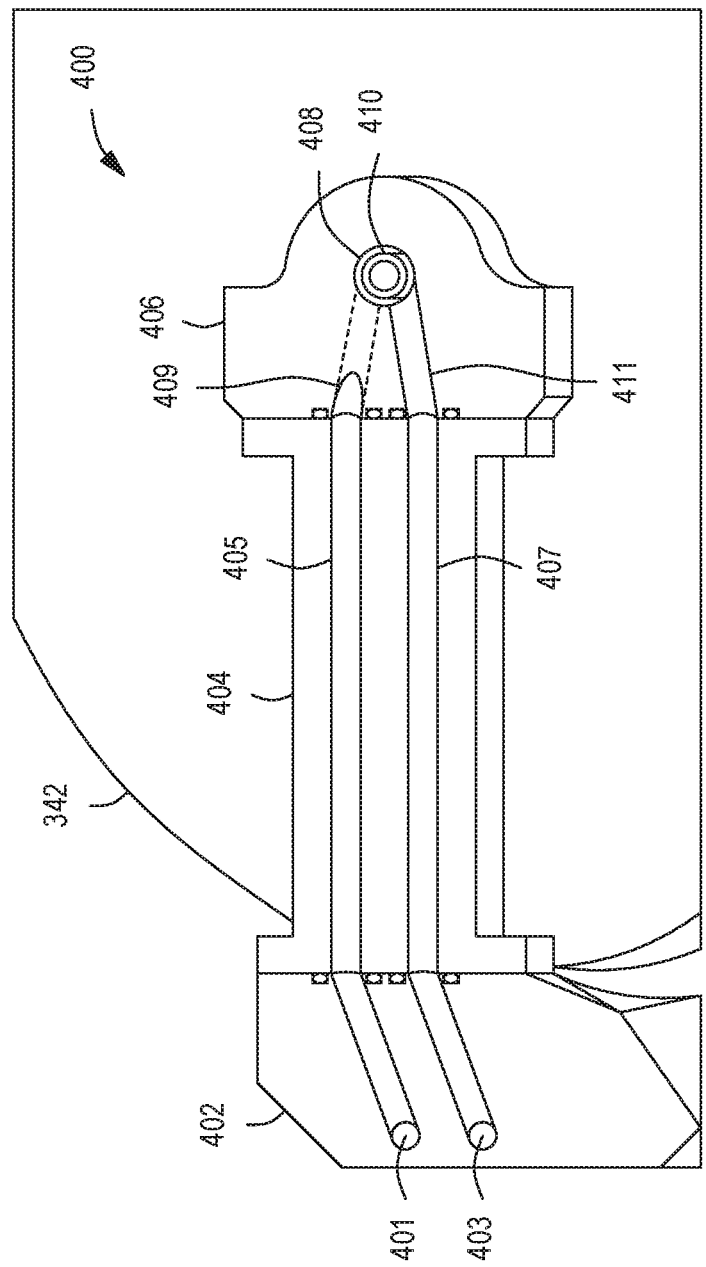
FIG. 4 depicts a perspective sectional view of a feedthrough assembly for use with a process chamber in accordance with some embodiments of the present disclosure.

FIG. 4 depicts a feedthrough assembly 400 in accordance with some embodiments of the present disclosure. The feedthrough assembly includes an inlet manifold 402 coupled to two or more gas sources (e.g., first and second ampoules 316, 366 and a carrier gas supply), an outlet manifold 406 coupled to the lid of a chamber (e.g., lid 342), and a gas feedthrough 404 coupled to the inlet manifold 402 at one end and the outlet manifold 406 at a second end opposite the first end. The gas feedthrough includes a first channel 405 and a second channel 407 fluidly coupled to a first outlet 401 and a second outlet 403, respectively, of the inlet manifold 402. The first and second channels 405, 407 are respectively fluidly coupled to a first inlet 409 and a second inlet 411 of the outlet manifold 406. In some embodiments, the second channel 407 has a diameter larger than that of the first channel 405 to accommodate the increased amount of precursor gas flowing from the first and second ampoules 316, 366. In some embodiments, the diameter of the second channel 407 may be between about 0.25 inches and about 0.4 inches. In some embodiments, the diameter of the second channel 407 may be about 0.29 inches.

The inventors have discovered that conventional gas feedthroughs employ a single channel through which both precursor and carrier gases flow. As a result, mixing of the precursor and the carrier gases occurs at the inlet of the channel of the gas feedthrough and a choke results. As such, the inventive gas feedthrough employs two separate channels 405, 407 to flow the carrier gas and precursor gas, respectively, to a mixing chamber 408 disposed in the outlet manifold 406. To improve the mixing of the precursor and carrier gases, a gas mixer 410 is disposed within the mixing chamber 408.

Figure 5A:
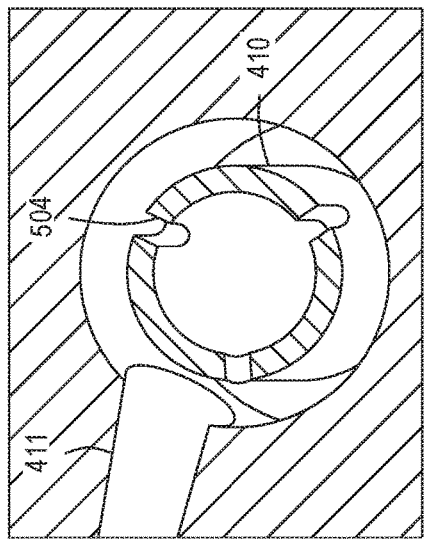
FIGS. 5A-5B depict perspective cross-sectional views of the mixer of FIG. 5 in accordance with some embodiments of the present disclosure.
Figure 5B:
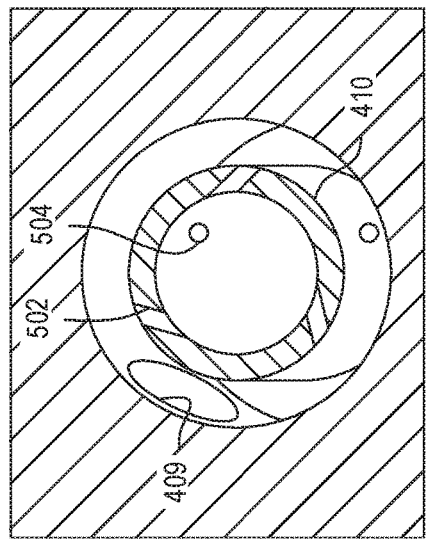
Figure 5:
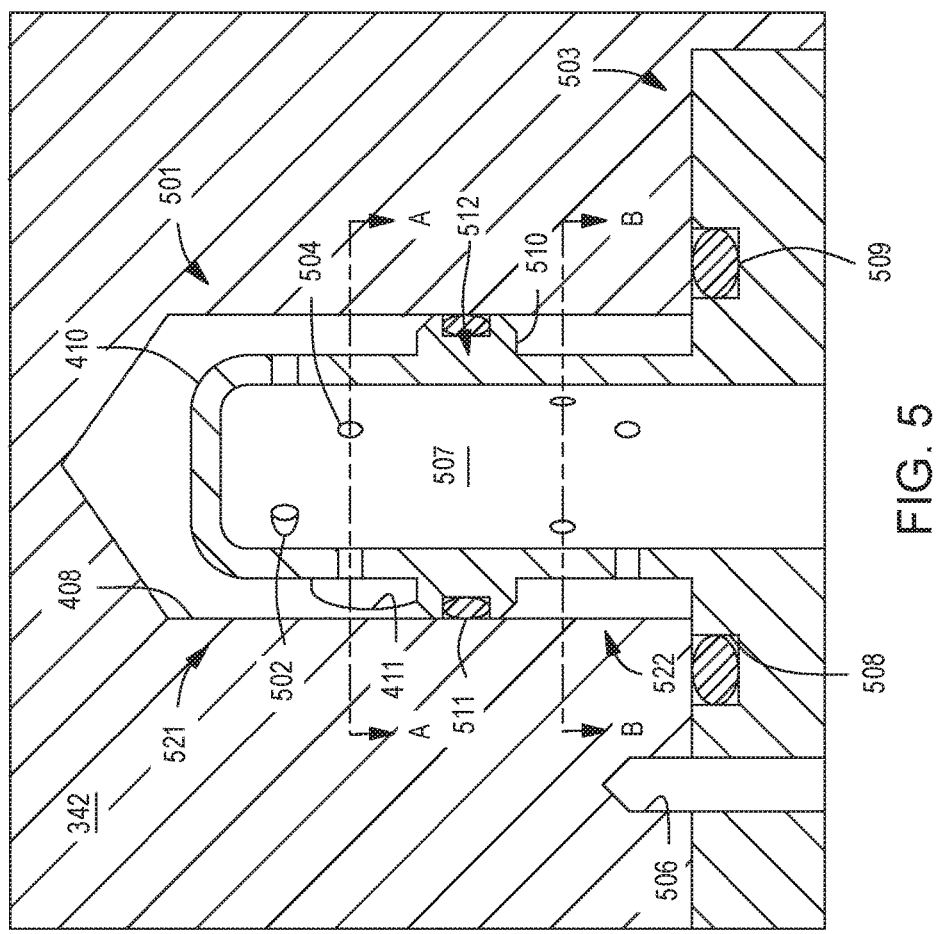
FIG. 5 depicts a cross-sectional side view of a mixer for use with a process chamber in accordance with some embodiments of the present disclosure.

FIGS. 5-5B illustrate cross sectional views of a gas mixer 410 in accordance with some embodiments of the present disclosure. The gas mixer 410 includes shaft 501 and a collar 503. The shaft 501 extends into the mixing chamber 408 from the collar 503 and has a diameter smaller than that of the mixing chamber so that plenum is formed between the shaft 501 and the inner walls of the mixing chamber 408. In some embodiments, the shaft 501 includes a plurality of tangential holes 502 and a plurality of radial holes 504 to fluidly couple the plenum to an inner volume 507 of the shaft 501. In some embodiments, the first and second inlets 409, 411 are coupled to the mixing chamber 408 at two different positions vertically spaced apart from each other to supply the precursor and carrier gases to different areas of the mixing chamber 408. As such, the shaft 501 includes an annular protrusion 510 having a first annular channel 511, in which a first o-ring 512 is disposed to separate the plenum into an upper plenum 521 and a lower plenum 522. Providing the precursor and carrier gases to separate plenums ensures that the gases do not mix prior to entering into the gas mixer 410.

In some embodiments, a threaded blind hole 506 may be formed in the collar 503 and the outlet manifold 406 to accommodate a screw (not shown) to couple the gas mixer 410 to the outlet manifold. In some embodiments, the gas mixer 410 may alternatively be coupled to the outlet manifold via other fixation means such as, for example, an adhesive. To ensure a proper seal around the gas mixing chamber, the collar 503 includes a second annular channel 508 in which a second o-ring 509 is disposed.

FIG. 5A is a cross-sectional view of the outlet manifold 406 taken along line A-A. FIG. 5B is a cross-sectional view of the outlet manifold 406 taken along line B-B. FIGS. 5A and 5B illustrate the coupling of the second inlet 411 to the upper plenum 521 and the first inlet 409 to the lower plenum 522 as well as the orientation of the plurality of tangential and radial holes 502, 504.

As a result of the above-described feedthrough assembly, the partial pressure necessary to deposit cobalt in the word line 204 is advantageously achieved. Returning to FIG. 3, although a showerhead 314 is shown, additional or alternative gas inlets may be provided such as nozzles or inlets disposed in the ceiling or on the sidewalls of the process chamber 302 or at other locations suitable for providing gases to the process chamber 302, such as the base of the process chamber, the periphery of the substrate support, or the like.

The apparatus 300 may utilize capacitively coupled RF energy for plasma processing. For example, the process chamber 302 may have a lid 342 made from dielectric materials and a showerhead 314 that is at least partially conductive to provide an RF electrode (or a separate RF electrode may be provided). The showerhead 314 (or other RF electrode) may be coupled to one or more RF power sources (one RF power source 348 shown) through one or more respective matching networks (matching network 346 shown). The one or more plasma sources may be capable of producing up to about 3,000 W, or in some embodiments, up to about 5,000 W, of RF energy at a frequency of about 2 MHz and/or about 13.56 MHz or a high frequency, such as 27 MHz and/or 60 MHz. The exhaust system 320 generally includes a pumping plenum 324 and one or more conduits that couple the pumping plenum 324 to the inner volume 305 (and generally, the processing volume 304) of the process chamber 302.

A vacuum pump 328 may be coupled to the pumping plenum 324 via a pumping port 326 for pumping out the exhaust gases from the process chamber via one or more exhaust ports (two exhaust ports 322 shown). 302. The vacuum pump 328 may be fluidly coupled to an exhaust outlet 332 for routing the exhaust to appropriate exhaust handling equipment. A valve 330 (such as a gate valve, or the like) may be disposed in the pumping plenum 324 to facilitate control of the flow rate of the exhaust gases in combination with the operation of the vacuum pump 328. Although a z-motion gate valve is shown, any suitable, process compatible valve for controlling the flow of the exhaust may be utilized.

To facilitate control of the process chamber 302 as described above, the controller 350 may be any form of general-purpose computer processor that can be used in an industrial setting for controlling various chambers and subprocessors. The memory, or computer-readable medium, 356 of the CPU 352 may be one or more of readily available memory such as random access memory (RAM), read only memory (ROM), floppy disk, hard disk, or any other form of digital storage, local or remote. The support circuits 354 are coupled to the CPU 352 for supporting the processor in a conventional manner. These circuits include cache, power supplies, clock circuits, input/output circuitry and subsystems, and the like.

The inventive methods disclosed herein may generally be stored in the memory 356 as a software routine 358 that, when executed by the CPU 352, causes the process chamber 302 to perform processes of the present disclosure. The software routine 358 may also be stored and/or executed by a second CPU (not shown) that is remotely located from the hardware being controlled by the CPU 352. Some or all of the method of the present disclosure may also be performed in hardware. As such, embodiments of the present disclosure may be implemented in software and executed using a computer system, in hardware as, e.g., an application specific integrated circuit or other type of hardware implementation, or as a combination of software and hardware. The software routine 358 may be executed after the substrate 200 is positioned on the substrate support 308. The software routine 358, when executed by the CPU 352, transforms the general purpose computer into a specific purpose computer (controller) 350 that controls the chamber operation such that the methods disclosed herein are performed.

The disclosure may be practiced using other semiconductor substrate processing systems wherein the processing parameters may be adjusted to achieve acceptable characteristics by those skilled in the art by utilizing the teachings disclosed herein without departing from the spirit of the disclosure. In addition to filling a word line, the above-described cobalt deposition process may be utilized for 3D NAND common source lines to provide decreased stress and substrate bowing, a seamless gap fill, and low resistivity.

While the foregoing is directed to embodiments of the present disclosure, other and further embodiments of the disclosure may be devised without departing from the basic scope thereof.

The invention claimed is:

1. A substrate processing chamber, comprising:
a chamber body having a processing volume;
a substrate support disposed within the chamber body and having a support surface to support a substrate;
a showerhead disposed opposite the substrate support configured to expose the substrate to a cobalt containing precursor;
a heat source disposed within the substrate support configured to heat the substrate to a predetermined temperature;
a first ampoule containing a cobalt precursor and coupled to the substrate processing chamber; and
a second ampoule containing the cobalt precursor and coupled to the substrate processing chamber;
further comprising:
an inlet manifold coupled to the first ampoules and the second ampoule;
an outlet manifold coupled to a lid of the substrate processing chamber; and
a gas feedthrough coupled to the inlet manifold at a first end and the outlet manifold at a second end opposite the first end;
wherein the gas feedthrough further comprises a first channel and a second channel fluidly coupled to a first outlet and a second outlet, respectively, of the inlet manifold.

2. The substrate processing chamber of claim 1, wherein the first and second channels are respectively fluidly coupled to a first inlet and a second inlet of the outlet manifold.

3. The substrate processing chamber of claim 2, wherein the second channel has a diameter larger than that of the first channel to accommodate an increased amount of precursor gas flowing from the first and second ampoules.

4. The substrate processing chamber of claim 3, wherein the diameter of the second channel is between about 0.25 inches and about 0.4 inches.

5. The substrate processing chamber of claim 3, wherein the diameter of the second channel is about 0.29 inches.

* * * * *